United States Patent
Liu et al.

(10) Patent No.: US 9,947,902 B2
(45) Date of Patent: Apr. 17, 2018

(54) PREFABRICATED SUBSTRATE OF ARRAY SUBSTRATE, VAPOR DEPOSITION METHOD, ARRAY SUBSTRATE AND DISPLAY APPARATUS

(71) Applicant: BOE TECHNOLOGY GROUP CO., LTD., Beijing (CN)

(72) Inventors: Libin Liu, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 715 days.

(21) Appl. No.: 14/555,777

(22) Filed: Nov. 28, 2014

(65) Prior Publication Data
US 2016/0019837 A1     Jan. 21, 2016

(30) Foreign Application Priority Data
Jul. 18, 2014     (CN) .......................... 2014 1 0345624

(51) Int. Cl.
*G09G 3/32*     (2016.01)
*H01L 51/56*    (2006.01)
(Continued)

(52) U.S. Cl.
CPC .......... *H01L 51/56* (2013.01); *H01L 27/3211* (2013.01); *H01L 27/3218* (2013.01); *H01L 27/3276* (2013.01)

(58) Field of Classification Search
CPC ....... H01L 51/56; H01L 25/167; H01L 27/15; H01L 31/12; H01L 33/00; H01L 27/3211; H01L 27/3218; H01L 27/3276
See application file for complete search history.

(56) References Cited

U.S. PATENT DOCUMENTS 6,699,739 B2     3/2004  Yamazaki et al.
7,211,944 B2 *   5/2007  Bae ..................... H01L 27/3253
                                                    257/40
(Continued)

FOREIGN PATENT DOCUMENTS

CN     103489390 A      1/2014
EP       1132980 A3     6/2005
EP       1132980 B1     5/2012

OTHER PUBLICATIONS

First Office Action dated Jun. 2, 2016 corresponding to Chinese application No. 201410345624.7.

*Primary Examiner* — Whitney T Moore
(74) *Attorney, Agent, or Firm* — Nath, Goldberg & Meyer; Joshua B. Goldberg

(57) ABSTRACT

The present invention provides a prefabricated substrate of array substrate, a vapor deposition method, an array substrate and a display apparatus, which can solve a problem that there is a waste of material in a vapor deposition process of the prior art. The prefabricated substrate comprises a plurality of sub-pixel units, each sub-pixel unit comprising a drive unit and a sub-pixel electrode connected with the drive unit, wherein, the drive unit is also connected with a data line and a gate line, and is used for transferring a data voltage signal outputted from the data line to the sub-pixel electrode when the gate line is strobed. The sub-pixel unit further comprises a switch unit connected with the data line and the sub-pixel electrode The switch unit is used for adjusting voltage of the sub-pixel electrode under control of a switch signal outputted from a switch signal line.

13 Claims, 2 Drawing Sheets

(51) Int. Cl.
*H01L 51/00* (2006.01)
*H01L 27/32* (2006.01)

(56) References Cited

U.S. PATENT DOCUMENTS

| | | | |
|---|---|---|---|
| 2004/0119406 A1 | 6/2004 | Kobayashi | |
| 2005/0001787 A1* | 1/2005 | Montgomery | G09G 3/003 345/6 |
| 2013/0119408 A1 | 5/2013 | Koyama | |
| 2014/0070196 A1* | 3/2014 | Kim | H01L 51/504 257/40 |
| 2014/0240304 A1* | 8/2014 | In | G09G 3/3233 345/212 |

* cited by examiner

PREFABRICATED SUBSTRATE OF ARRAY SUBSTRATE, VAPOR DEPOSITION METHOD, ARRAY SUBSTRATE AND DISPLAY APPARATUS

CROSS-REFERENCE TO RELATED APPLICATION

This application claims priority to Chinese Patent Application No. 201410345624.7, filed on Jul. 18, 2014 in the Chinese Intellectual Property Office, the disclosure of which is incorporated by reference herein in its entirety.

FIELD OF THE INVENTION

The present invention relates to the field of circuit control for organic electroluminescent devices and vapor deposition technology, and particularly, to a prefabricated substrate for an array substrate, a vapor deposition method, an array substrate and a display apparatus.

BACKGROUND OF THE INVENTION

A pixel of an OLED display is a light emitting diode constituted of a stacked structure. In a color pixel structure constituted of a red (R) sub-pixel, a green (G) sub-pixel and a blue (B) sub-pixel, positions and shapes of light emitting layers (EMLs) of sub-pixels in different colors should respectively correspond to electrodes (generally anodes, hereafter referred to as "sub-pixel electrodes") of sub-pixels in different colors, in addition, the lower structure and the upper structure of the EMLs are common layers of the (sub) pixels in different colors. The light emitting layers of sub-pixels in different colors are made of different materials and have different vapor deposition target regions and patterns, thus they should be vapor deposited respectively. If material of EML of a sub-pixel in one color is deposited on a region of a sub-pixel electrode corresponding to another color, color mixing will be caused.

In order to limit deposition region of scattering particles during a vapor deposition process so as to form a light emitting layer with a predefined pattern at a specific position, the mainstream technology currently used in the industry is that, a fine metal mask (FMM) is located close to a substrate to prevent undesired particles from being deposited on regions of the substrate except for regions corresponding to holes of the FMM during a vapor deposition process. The holes of the FMM are aligned with sub-pixel electrode regions to be vapor deposited. Particles of organic electroluminescent material may be deposited on the sub-pixel electrode regions to form light emitting layers in shapes similar to that of the holes of the FMM. Different materials will be deposited by moving the FMM or using different FMMs to form desired organic light emitting layers of sub-pixel electrodes in different colors respectively.

However, the inventor found that there are following technical problems in technical solutions of the prior art, in which vapor deposition processes are performed by using the FMM(s). First, the FMM may be deformed due to gravity of deposited material and variation of temperature for vapor deposition, so that precision of positions and patterns of the light emitting layers formed by vapor depositing may be affected. Secondly, since shield function of the FMM, only a little of EML material will be deposited as the light emitting layer through the FMM, and other material will be deposited on the FMM so as to be wasted.

SUMMARY OF THE INVENTION

In view of the above technical problem of the vapor deposition processes in the prior art, the present invention provides a prefabricated substrate for an array substrate, a vapor deposition method, an array substrate and a display apparatus, which can reduce cost and realize display detecting.

One technical solution of the present invention is a prefabricated substrate for an array substrate, which comprises a plurality of sub-pixel units, each of the sub-pixel units comprising a drive unit and a sub-pixel electrode connected with the drive unit, wherein the drive unit is also connected with a data line and a gate line, and is used for transferring a data voltage signal outputted from the data line to the sub-pixel electrode when the gate line is strobed, the sub-pixel unit further comprises a switch unit connected with the data line and the sub-pixel electrode, and the switch unit is used for adjusting voltage of the sub-pixel electrode under control of a switch signal outputted from a switch signal line.

With the prefabricated substrate of the present invention, in a vapor deposition, organic electroluminescent materials for sub-pixel units in different colors can be accurately deposited onto corresponding sub-pixel electrodes respectively without waste of the materials and use of masks, thus the cost will be reduced.

Preferably, the prefabricated substrate of the present invention further comprises at least one group of data voltage signal source ports and at least one group of switch signal source ports, wherein, each group of the data voltage signal source ports comprises a plurality of data voltage signal source sub-ports corresponding to the sub-pixel units in different colors, each data voltage signal source sub-port is connected with the data line corresponding to the sub-pixel unit in one color and used for transferring the data voltage signal to the data line; each group of the switch signal source ports comprises a plurality of switch signal source sub-ports corresponding to the sub-pixel units in different colors, each switch signal source sub-port is connected with the switch unit corresponding to the sub-pixel unit in one color and used for turning on the connected switch unit to transfer the data voltage signal outputted from the data line corresponding to the sub-pixel unit to corresponding sub-pixel electrode.

Further preferably, the plurality of sub-pixel units of the prefabricated substrate are divided into a plurality of sub-pixel unit groups, wherein each of the sub-pixel unit groups corresponds to one group of data voltage signal source ports and one group of switch signal source ports.

Preferably, the drive unit comprises a drive transistor, a switch transistor, and a storage capacitor, wherein, a gate of the switch transistor is connected with the gate line, a source of the switch transistor is connected with the data line, a drain of the switch transistor is connected with a gate of the drive transistor, a source of the drive transistor is connected with a power supply voltage, and a drain of the drive transistor is connected with the sub-pixel electrode.

Preferably, the switch unit is a thin film transistor, a gate of the thin film transistor is connected with the switch signal line, a source of the thin film transistor is connected with the data line, and a drain of the thin film transistor is connected with the sub-pixel electrode.

Another technical solution of the present invention is a vapor deposition method for organic electroluminescent material, wherein, the organic electroluminescent material is vapor deposited by using the above prefabricated substrate of the present invention, the vapor deposition method comprises: turning on switch units of the sub-pixel units, so that a voltage with a polarity opposite to that of charges of the organic electroluminescent material to be vapor deposited is applied to the sub-pixel electrode corresponding to the organic electroluminescent material to be vapor deposited by using the prefabricated substrate through the data line, and a voltage with a same polarity as that of charges of the organic electroluminescent material to be vapor deposited is applied to other sub-pixel electrodes, thereby the organic electroluminescent material is vapor deposited onto the sub-pixel electrode corresponding thereto.

Preferably, the vapor deposition method further comprises: providing a grid shaped electrode or a grid shaped electrode group between a vapor deposition source and the prefabricated substrate, and a voltage with a same polarity as that of charges of the organic electroluminescent material to be vapor deposited is applied to the grid shaped electrode or the grid shaped electrode group.

Another technical solution of the present invention is an array substrate comprising the above prefabricated substrate, wherein light emitting layers in corresponding colors are provided on the sub-pixel electrodes of the prefabricated substrate and a second electrode is provided on the light emitting layer.

Still another technical solution of the present invention is a display apparatus comprising the above array substrate.

REFERENCE SIGNS 1, prefabricated substrate for array substrate; 2, sub-pixel electrode; 3, vacuum chamber; 4, vapor deposition source; 5, grid shaped electrode (group).

DETAILED DESCRIPTION OF EMBODIMENTS

Hereinafter, the present invention will be described in detail in conjunction with accompanying drawings and specific embodiments so that persons skilled in the art can understand technical solutions of the present invention better.

Figure 1:
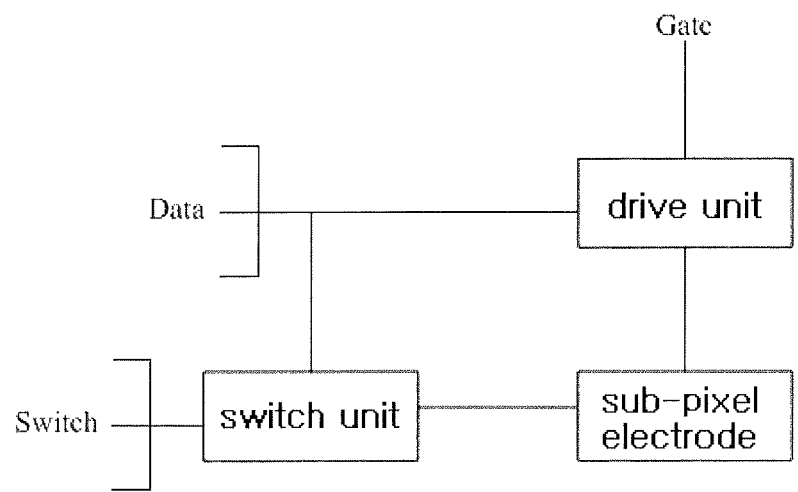
FIG. 1 shows an exemplary configuration diagram of a sub-pixel unit of a prefabricated substrate for an array substrate according to an embodiment of the present invention.

An embodiment of the present invention provides a prefabricated substrate for an array substrate comprising a plurality of sub-pixel units. As shown in FIG. 1, each of the sub-pixel units comprises a drive unit, a sub-pixel electrode connected with the drive unit and a switch unit, wherein the drive unit is also connected with a data line (Data) and a gate line (Gate), and is used for transferring a data voltage signal outputted from the data line to the sub-pixel electrode when the gate line is strobed, the switch unit is connected with the data line and the sub-pixel electrode, and is used for adjusting voltage of the sub-pixel electrode under control of a switch signal outputted from a switch signal line (Switch).

It should be noted that, the prefabricated substrate of the present embodiment is particularly suitable for vapor deposition processes of light emitting materials for organic electroluminescent devices (OLED). Thus, the present embodiment further provides a vapor deposition method for organic electroluminescent material, which comprises: turning on switch units of the sub-pixel units, so that a voltage with a polarity opposite to that of charges of the organic electroluminescent material to be vapor deposited is applied to the sub-pixel electrode corresponding to the organic electroluminescent material to be vapor deposited by using the prefabricated substrate through the data line, and a voltage with a same polarity as that of charges of the organic electroluminescent material to be vapor deposited is applied to other sub-pixel electrodes, thereby the organic electroluminescent material is vapor deposited onto the sub-pixel electrode corresponding thereto. Preferably, the vapor deposition method further comprises: providing a grid shaped electrode or a grid shaped electrode group between a vapor deposition source and the prefabricated substrate, and a voltage with a same polarity as that of charges of the organic electroluminescent material to be vapor deposited is applied to the grid shaped electrode or the grid shaped electrode group.

Specifically, the present embodiment will be described in conjunction with FIG. 2.

Figure 2:
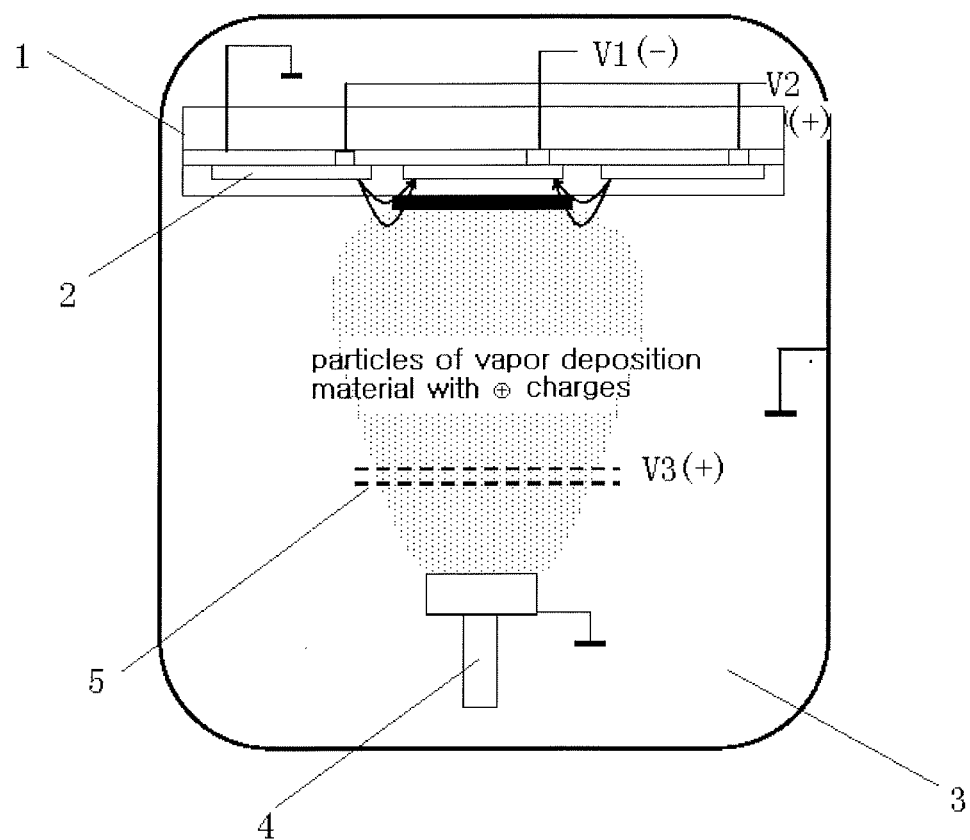
FIG. 2 shows a diagram of an application of a prefabricated substrate for an array substrate according to an embodiment of the present invention to a vapor deposition process.

Seen from FIG. 2, the prefabricated substrate 1 comprises a drive unit (with reference to FIG. 1) formed on a base, and a sub-pixel electrode 2 connected with the drive unit. The prefabricated substrate 1 is located in a vacuum chamber 3, and the sub-pixel electrode 2 of the prefabricated substrate 1 and a vapor deposition source 4 are provided oppositely. By providing an ion generating device or other device for making material particles charged in front of the vapor deposition source 4, charges with a predefined polarity are carried by the material particles to be vapor deposited. With the vapor deposition of light emitting material for a red organic electroluminescent device as an example, the polarity of the charges carried by the material particles to be vapor deposited is assumed to be positive (+). The switch units connected with sub-pixel electrodes 2 corresponding to organic electroluminescent devices in different colors will be turned on by switch signals outputted from switch signal lines. In this case, data voltage signals will be outputted from data lines connected with the switch units to sub-pixel electrodes corresponding to the organic electroluminescent devices in different colors. Specifically, a voltage V1 (−) will be applied to the sub-pixel electrode 2 corresponding to the red organic electroluminescent device, and a voltage V2 (+) is applied to sub-pixel electrodes 2 corresponding to organic electroluminescent devices in other colors, that is, polarity of the voltage applied to the sub-pixel electrode 2 corresponding to the red organic electroluminescent device is different from that of the charges carried by the material particles to be vapor deposited, and polarity of the voltage applied to the sub-pixel electrodes 2 corresponding to the organic electroluminescent devices in other colors is the same as that of the charges carried by the material particles to be vapor deposited. In this case, electrical fields will be formed between the sub-pixel electrode 2 corresponding to the red organic electroluminescent device and the sub-pixel electrodes 2 corresponding to the organic electroluminescent devices in other colors. Due to electrostatic effect (charges with the same polarity repel to each other and charges with opposite polarities attract with each other), the material particles with positive charges for the red organic electroluminescent device will be repelled by the sub-pixel electrodes 2 corresponding to the organic electroluminescent devices in other colors and attracted by the sub-pixel electrode 2 corresponding to the red organic electroluminescent device during their motion oriented to the sub-pixel electrode 2.

Of course, in order to adjusting motion speed of the oriented motion of the charged particles to the prefabricated substrate 1 so that the charged particles will be deposited on the prefabricated substrate 1 under effective control of the electrical fields between the sub-pixel electrodes 2, a grid shaped electrode (group) 5 may be provided in front of the vapor deposition source 4. A voltage V3 (+) is applied to the grid shaped electrode (group) 5, that is, polarity of the voltage applied to the grid shaped electrode (group) 5 is the same as that of the charges carried by the material particles for the red organic electroluminescent device. In this case, the material particles to be vapor deposited will move to a direction away from the grid shaped electrode (group). Since an electrical field is formed between the grid shaped electrode (group) 5 and the sub-pixel electrode 2 corresponding to the red organic electroluminescent device, the charged material particles to be vapor deposited will be deposited on the sub-pixel electrode 2 corresponding to the red organic electroluminescent device more accurately and rapidly. It should be understood that, the charged material particles from the vapor deposition source 4 can pass through the grid shaped electrode (group) 5 to move toward corresponding sub-pixel electrode 2.

By applying the prefabricated substrate of the present embodiment into vapor deposition processes, material particles for light emitting layers of organic electroluminescent devices in different colors can be deposited onto corresponding sub-pixel electrodes more accurately without using any mask, and the material for vapor deposition can be saved.

Preferably, the prefabricated substrate of the present embodiment further comprises at least one group of data voltage signal source ports and at least one group of switch signal source ports, wherein, each group of the data voltage signal source ports comprises a plurality of data voltage signal source sub-ports corresponding to the sub-pixel units in different colors, each data voltage signal source sub-port is connected with the data line corresponding to the sub-pixel unit in one color and used for transferring the data voltage signal to the data line; each group of the switch signal source ports comprises a plurality of switch signal source sub-ports corresponding to the sub-pixel units in different colors, each switch signal source sub-port is connected with the switch unit corresponding to the sub-pixel unit in one color and used for turning on the switch unit connected therewith to transfer the data voltage signal outputted from the data line corresponding to the sub-pixel unit to corresponding sub-pixel electrode.

Specifically, when a strobe signal is received by a switch signal source sub-port corresponding to a sub-pixel unit in a certain color, switch units connected with this switch signal source sub-port will be turned on. In this case, a voltage with a polarity opposite to that of the charges carried by the material particles to be vapor deposited is applied to the data voltage signal source sub-port corresponding to the sub-pixel unit in this color, and this voltage will be transferred to the sub-pixel electrode of the sub-pixel unit in corresponding color.

With application of the prefabricated substrate of the present embodiment in vapor deposition processes, data lines of the prefabricated substrate can be used so that there is no need to separately provide data lines, thus cost may be reduced.

Since there are voltage drops on the data lines and the switch signal lines, and the longer the data lines and the switch signal lines are, the larger the resistances thereof are, and the larger the voltage drops thereon are, thus uniformity of deposition on the prefabricated substrate will be affected. Therefore, further preferably, the plurality of sub-pixel units of the prefabricated substrate are divided into a plurality of sub-pixel unit groups, wherein each of the sub-pixel unit groups corresponds to one group of data voltage signal source ports and one group of switch signal source ports. In other words, the entire prefabricated substrate is divided into a plurality of regions, the material particles will be vapor deposited onto each region by function of one group of data voltage signal source ports and one group of switch signal source ports. For example, each of four vertex angles of the entire prefabricated substrate will be provided with one group of data voltage signal source ports and one group of switch signal source ports thereon.

Preferably, the drive unit comprises a drive transistor, a switch transistor, and a storage capacitor, wherein, a gate of the switch transistor is connected with the gate line, a source of the switch transistor is connected with the data line, a drain of the switch transistor is connected with a gate of the drive transistor, a source of the drive transistor is connected with a power supply voltage, and a drain of the drive transistor is connected with the sub-pixel electrode. That is to say, the drive unit in the present embodiment is a 2T1C drive unit. Of course, the drive unit in the present embodiment is not limited to the 2T1C drive unit, and it may be a 3T2C drive unit, a 6T2C drive unit or the like. Since circuits of these basic drive units are known to persons skilled in the art, they will not be described in detail here.

Preferably, the switch unit is a thin film transistor, a gate of the thin film transistor is connected with the switch signal line, a source of the thin film transistor is connected with the data line, and a drain of the thin film transistor is connected with the sub-pixel electrode. Of course, the switch unit may be any other switch device.

The present embodiment will be further described in conjunction with a circuit of a prefabricated substrate provided with a 6T2C drive unit.

Figure 3:
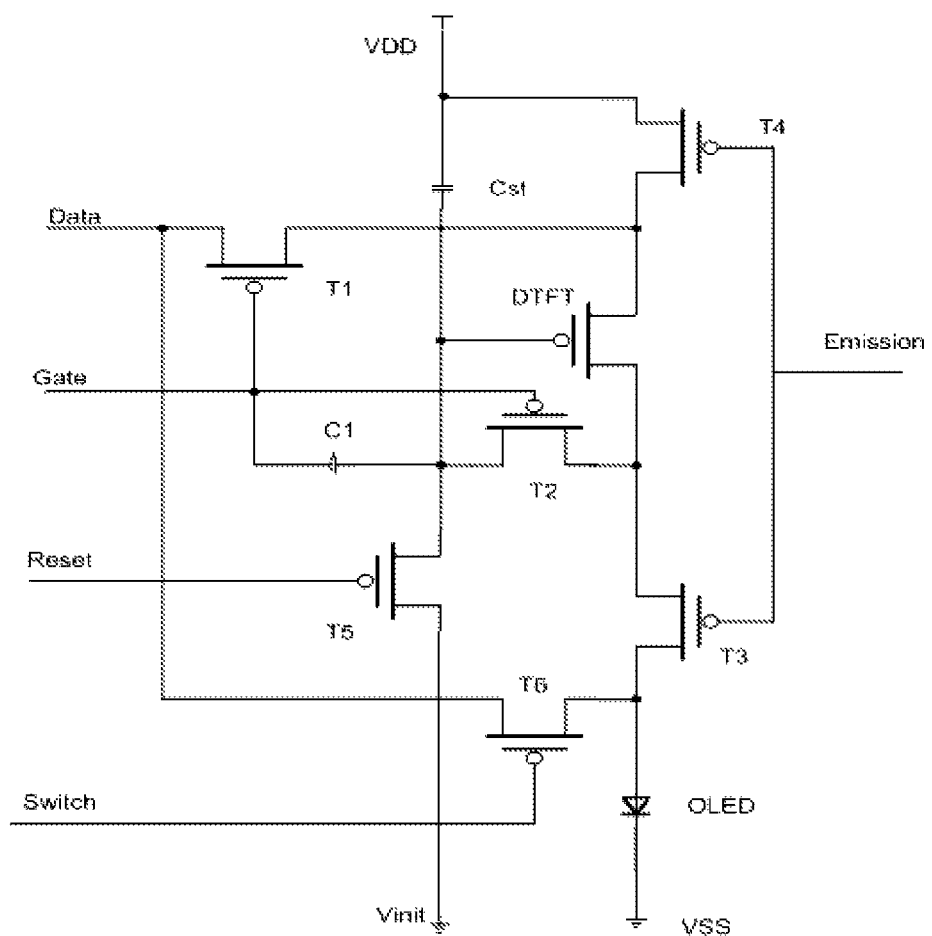
FIG. 3 shows a circuit diagram of a prefabricated substrate according to an embodiment of the present invention.

As shown in FIG. 3, a switch transistor T6 is further used in addition to a 6T2C drive unit. A source of the T6 is connected with the data line. A drain of the T6 is connected with an anode (i.e., the sub-pixel electrode) of an organic electroluminescent device (OLED). During an electrostatic vapor deposition process, a low level is applied to a gate of the T6 so that the T6 is turned on, and voltage of each sub-pixel electrode is set by the data line Data. For example, after the T6 being turned on, when a low level (i.e., a negative voltage) is applied to the data voltage signal source sub-port Rdata of the red sub-pixel unit, a high level (i.e., a positive voltage) is applied to the data voltage signal source sub-port Gdata of the green sub-pixel unit and the data voltage signal source sub-port Bdata of the blue sub-pixel unit, the positive charged particles to be vapor deposited will be deposited directionally onto the red sub-pixel electrode. Magnitude of the voltage of Rdata may be changed arbitrarily so that deposition speed of the particles can be controlled.

On the basis of the above prefabricated substrate for an array substrate, the present embodiment also provides an array substrate comprising the above prefabricated substrate, light emitting layers in corresponding colors are provided on the sub-pixel electrodes of the prefabricated substrate and a second electrode (i.e., cathode of the organic electroluminescent device) is provided on the light emitting layer, wherein the sub-pixel electrode, the light emitting layer and the second electrode constitute an entire organic electroluminescent device. It should be understood that, the array substrate comprises the drive units and the organic electroluminescent devices connected with the drive units.

The array substrate of the present embodiment may be applied into a detection of pixel units thereon. Specifically, when the switch unit corresponding to the sub-pixel unit in one color is turned on, a voltage is applied to the data voltage signal source sub-port corresponding to the sub-pixel unit in this color, then the organic electroluminescent device connected with the data voltage signal source sub-port through the data line is lighted up. If there is a normal display, the sub-pixel unit in this color will be normal, or vice versa.

On the basis of the above array substrate, the present embodiment also provides a display apparatus comprising the above array substrate.

The display apparatus may be a mobile phone, a tablet computer, a television, a display, a notebook computer, a digital photo frame, a navigator or any other product or member with a display function.

Of course, the display apparatus of the present embodiment may further comprise other conventional structures such as a power supply unit, a display drive unit and the like.

It should be understood that, the above embodiments are only used to explain the principle of the present invention, but not to limit the present invention. A person skilled in the art can make various variations and modifications without departing from spirit and scope of the present invention, and the variations and the modifications are also considered to be within the protection scope of the present invention.

The invention claimed is:

1. A prefabricated substrate for an array substrate, comprising a plurality of sub-pixel units, each of the sub-pixel units comprising a drive unit and a sub-pixel electrode connected with the drive unit, wherein the drive unit is also connected with a data line and a gate line, and is used for transferring a data voltage signal outputted from the data line to the sub-pixel electrode in a case that the gate line is strobed, and wherein each sub-pixel unit further comprises a switch unit connected with the data line and the sub-pixel electrode, the switch unit being used for adjusting voltage of the sub-pixel electrode under control of a switch signal outputted from a switch signal line, the prefabricated substrate further comprises at least one group of data voltage signal source ports and at least one group of switch signal source ports, wherein, each group of the data voltage signal source ports comprises a plurality of data voltage signal source sub-ports corresponding to the sub-pixel units in different colors, each data voltage signal source sub-port is connected with the data line corresponding to the sub-pixel unit in one color and used for transferring the data voltage signal to the data line;

each group of the switch signal source ports comprises a plurality of switch signal source sub-ports corresponding to the sub-pixel units in different colors, each switch signal source sub-port is connected with the switch unit corresponding to the sub-pixel unit in one color and used for turning on the switch unit connected therewith to transfer the data voltage signal outputted from the data line corresponding to the sub-pixel unit to corresponding sub-pixel electrode.

2. The prefabricated substrate of claim 1, wherein the plurality of sub-pixel units of the prefabricated substrate are divided into a plurality of sub-pixel unit groups, and wherein, each of the sub-pixel unit groups corresponds to one group of data voltage signal source ports and one group of switch signal source ports.

3. The prefabricated substrate of claim 2, wherein the switch unit is a thin film transistor, a gate of the thin film transistor is connected with the switch signal line, a source of the thin film transistor is connected with the data line, and a drain of the thin film transistor is connected with the sub-pixel electrode.

4. The prefabricated substrate of claim 1, wherein the drive unit comprises a drive transistor, a switch transistor, and a storage capacitor, and wherein, a gate of the switch transistor is connected with the gate line, a source of the switch transistor is connected with the data line, a drain of the switch transistor is connected with a gate of the drive transistor, a source of the drive transistor is connected with a power supply voltage, and a drain of the drive transistor is connected with the sub-pixel electrode.

5. The prefabricated substrate of claim 4, wherein the switch unit is a thin film transistor, a gate of the thin film transistor is connected with the switch signal line, a source of the thin film transistor is connected with the data line, and a drain of the thin film transistor is connected with the sub-pixel electrode.

6. The prefabricated substrate of claim 1, wherein the switch unit is a thin film transistor, a gate of the thin film transistor is connected with the switch signal line, a source of the thin film transistor is connected with the data line, and a drain of the thin film transistor is connected with the sub-pixel electrode.

7. The prefabricated substrate of claim 1, wherein the switch unit is a thin film transistor, a gate of the thin film transistor is connected with the switch signal line, a source of the thin film transistor is connected with the data line, and a drain of the thin film transistor is connected with the sub-pixel electrode.

8. A vapor deposition method for organic electroluminescent material, wherein the organic electroluminescent material is vapor deposited by using a prefabricated substrate, the prefabricated substrate comprises a plurality of sub-pixel units, each of the sub-pixel units comprising a drive unit and a sub-pixel electrode connected with the drive unit, wherein the drive unit is also connected with a data line and a gate line, and is used for transferring a data voltage signal outputted from the data line to the sub-pixel electrode in a case that the gate line is strobed, and wherein each sub-pixel unit further comprises a switch unit connected with the data line and the sub-pixel electrode, the switch unit being used for adjusting voltage of the sub-pixel electrode under control of a switch signal outputted from a switch signal line, wherein the vapor deposition method comprises:

turning on switch units of the sub-pixel units, so that a voltage with a polarity opposite to that of charges of the organic electroluminescent material to be vapor deposited is applied to the sub-pixel electrode corresponding to the organic electroluminescent material to be vapor deposited by using the prefabricated substrate through the data line, and a voltage with a same polarity as that of charges of the organic electroluminescent material to be vapor deposited is applied to other sub-pixel electrodes, thereby the organic electroluminescent material is vapor deposited onto the sub-pixel electrode corresponding thereto.

9. The vapor deposition method of claim 8, further comprising: providing a grid shaped electrode or a grid shaped electrode group between a vapor deposition source and the prefabricated substrate, and a voltage with a same polarity as that of charges of the organic electroluminescent material to be vapor deposited is applied to the grid shaped electrode or the grid shaped electrode group.

10. An array substrate comprising a prefabricated substrate, the prefabricated substrate comprising a plurality of sub-pixel units, each of the sub-pixel units comprising a drive unit and a sub-pixel electrode connected with the drive unit, wherein the drive unit is also connected with a data line and a gate line, and is used for transferring a data voltage signal outputted from the data line to the sub-pixel electrode in a case that the gate line is strobed, and wherein each sub pixel unit further comprises a switch unit connected with the data line and the sub-pixel electrode, the switch unit being used for adjusting voltage of the sub-pixel electrode under control of a switch signal outputted from a switch signal line, wherein light emitting layers in corresponding colors are provided on the sub-pixel electrodes of the prefabricated substrate and a $2^{nd}$ electrode is provided on each of the light emitting layers, wherein the prefabricated substrate further comprises at least one group of data voltage signal source ports and at least one group of switch signal source ports, wherein, each group of the data voltage signal source ports comprises a plurality of data voltage signal source sub-ports corresponding to the sub-pixel units in different colors, each data voltage signal source sub-port is connected with the data line corresponding to the sub-pixel unit in one color and used for transferring the data voltage signal to the data line;

each group of the switch signal source ports comprises a plurality of switch signal source sub-ports corresponding to the sub-pixel units in different colors, each switch signal source sub-port is connected with the switch unit corresponding to the sub-pixel unit in one color and used for turning on the switch unit connected therewith to transfer the data voltage signal outputted from the data line corresponding to the sub-pixel unit to corresponding sub-pixel electrode.

11. The array substrate of claim 10, wherein the plurality of sub-pixel units of the prefabricated substrate are divided into a plurality of sub-pixel unit groups, and wherein, each of the sub-pixel unit groups corresponds to one group of data voltage signal source ports and one group of switch signal source ports.

12. The array substrate of claim 10, wherein the drive unit comprises a drive transistor, a switch transistor, and a storage capacitor, and wherein, a gate of the switch transistor is connected with the gate line, a source of the switch transistor is connected with the data line, a drain of the switch transistor is connected with a gate of the drive transistor, a source of the drive transistor is connected with a power supply voltage, and a drain of the drive transistor is connected with the sub-pixel electrode.

13. The array substrate of claim 10, wherein the switch unit is a thin film transistor, a gate of the thin film transistor is connected with the switch signal line, a source of the thin film transistor is connected with the data line, and a drain of the thin film transistor is connected with the sub-pixel electrode.

* * * * *